(12) United States Patent
Kim et al.

(10) Patent No.: US 8,751,900 B2
(45) Date of Patent: Jun. 10, 2014

(54) STORAGE DEVICE HAVING A NON-VOLATILE MEMORY DEVICE AND COPY-BACK METHOD THEREOF

(75) Inventors: Yong June Kim, Seoul (KR); Hong Rak Son, Anyang-si (KR); Seonghyeog Choi, Hwaseong-si (KR); Junjin Kong, Yongin-si (KR); Yongtaew Yim, Suwon-si (KR); Jaehong Kim, Seoul (KR); KyoungLae Cho, Yongin-si (KR); Wootae Chang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 230 days.

(21) Appl. No.: 13/106,892

(22) Filed: May 13, 2011

(65) Prior Publication Data
US 2011/0283166 A1    Nov. 17, 2011

(30) Foreign Application Priority Data

May 14, 2010 (KR) ........................ 10-2010-0045521

(51) Int. Cl.
*G11C 29/00* (2006.01)
*H03M 13/00* (2006.01)

(52) U.S. Cl.
USPC ............ 714/763; 714/782; 714/784; 714/785

(58) Field of Classification Search
CPC ........ G11C 29/00; G11C 29/42; G11C 29/52; G06F 11/0727; G06F 11/1666
USPC ........ 714/718, 746, 751–756, 758, 763–764, 714/781, 782, 784–787, 799–800, 805, 714/6.24, 6.3, 6.31–6.32, 29, 42, 54; 365/200, 201; 711/100, 104, 105, 711/111–112, 147, 153–154, 170–173
See application file for complete search history.

(56) References Cited

U.S. PATENT DOCUMENTS

| 7,203,791 B2 * | 4/2007 | Lee .............................. 711/103 |
| 8,339,854 B2 * | 12/2012 | Yoon ........................ 365/185.12 |
| 2012/0144272 A1 * | 6/2012 | Franceschini et al. ........ 714/773 |

FOREIGN PATENT DOCUMENTS

| JP | 09-282231 | 10/1997 |
| JP | 2000-137780 | 5/2000 |
| KR | 1020070109686 | 11/2007 |

* cited by examiner

*Primary Examiner* — Christine Tu
(74) *Attorney, Agent, or Firm* — Stanzione & Kim, LLP

(57) ABSTRACT

A storage device includes a non-volatile memory device outputting read data from a source area and a memory controller configured to execute an ECC operation on a plurality of vectors in the read data and to write the error-corrected read data into target area of the non-volatile memory device. The memory controller declares that a vector corresponding to a clean area is decoding pass without using a flag bit among the plurality of vectors during the error correction operation.

20 Claims, 15 Drawing Sheets

Fig. 6A $$H = \begin{bmatrix} 1 & 0 & 1 & 0 & 1 & 0 & 1 \\ 1 & 1 & 0 & 0 & 1 & 1 & 0 \\ 0 & 1 & 1 & 1 & 0 & 0 & 1 \end{bmatrix}$$

Row Weight of H $$\begin{bmatrix} 4 \\ 4 \\ 4 \end{bmatrix} \begin{matrix} \to \text{Even} \\ \to \text{Even} \\ \to \text{Even} \end{matrix}$$

Fig. 6B $$H' = \begin{bmatrix} 1 & 0 & 0 & 1 & 1 & 0 \\ 0 & 1 & 0 & 1 & 1 & 1 \\ 0 & 0 & 1 & 0 & 1 & 1 \end{bmatrix}$$

Row Weight of H'

$$\begin{bmatrix} 3 \\ 4 \\ 3 \end{bmatrix} \begin{matrix} \to \text{Odd} \\ \to \text{Even} \\ \to \text{Odd} \end{matrix}$$

⇩ Parity Check Matrix for all one code word $$H = [H' \mid e] = \begin{bmatrix} 1 & 0 & 0 & 1 & 1 & 0 & | & 1 \\ 0 & 1 & 0 & 1 & 1 & 1 & | & 0 \\ 0 & 0 & 1 & 0 & 1 & 1 & | & 1 \end{bmatrix}$$

Row Weight of H $$\begin{bmatrix} 4 \\ 4 \\ 4 \end{bmatrix} \begin{matrix} \to \text{Even} \\ \to \text{Even} \\ \to \text{Even} \end{matrix}$$

US 8,751,900 B2

STORAGE DEVICE HAVING A NON-VOLATILE MEMORY DEVICE AND COPY-BACK METHOD THEREOF

CROSS-REFERENCE TO RELATED APPLICATIONS

This U.S. non-provisional patent application claims the benefit of priority under 35 U.S.C §119 of Korean Patent Application 2010-0045521 filed on May 14, 2010, the entire contents of which are hereby incorporated by reference.

BACKGROUND OF THE INVENTION

1. Field of the Invention

Embodiments of the present general inventive concept relate to data storage devices and information processing systems incorporating such data storage devices.

2. Description of the Related Art

Semiconductor memory devices are generally classified into volatile memory devices and nonvolatile memory devices. The volatile memory devices have a high read/write speed but lose data stored therein when external power supply thereto is interrupted. On the other hand, the nonvolatile memory devices retain data stored therein even when external power supply thereto is interrupted. Therefore, the nonvolatile memory devices are used to store data regardless of whether power is supplied thereto. In particular, due to large-scale data storage capacity, flash memory is widely used as mass data storage medium.

With recent technological development and price reduction of flash memory devices, flash memories are being used as storage media to replace HDDs. The above storage devices are also called semiconductor disk devices, solid state drives, or solid state disks. Hereinafter, the storage devices will be briefly referred to as SSDs. High-speed data I/O is possible in an access operation to an SSD, and mechanical delay or error rate is significantly low. Also, the SSDs are not easily damaged by external impacts, and have excellent properties in generation of heat, noise, and power consumption. Furthermore, SSDs have the advantages of compactness and lightness. Accordingly, demand for SSDs, which do not use a platter rotating mechanically, has rapidly increased in accordance with today's mobile trends of low-power and large-capacity.

In SSDs or flash memory devices, a copy-back operation may be executed. The copy-back operation is page data copy operation from a source page to a target page, where a "page" is defined as a unit of storage data (e.g. 212 physical storage bits may correspond to one page). The copy-back operation is frequently executed during "Garbage-collection" or "Merge" operations. There is an external copy-back (or Semi-external copy-back) scheme for improving integrity of the copy-back data. In the external copy-back or semi-external copy-back operation, an error correction code ECC operation is performed on the read data from the source page. For performing the ECC operation, the read data must be output from the flash memory device.

However, each of the plurality of sectors in a single page may have varieties of data states. In a single page, there may be a user data in one sector while there may be no substantial data in another sector. The ECC engine, which regards one sector as a code word unit, should be designed considering the above-described sector states. In particular, the ECC algorithm for the storage device performing an external copy-back or semi-external copy-back should be designed considering above mentioned sector states.

SUMMARY OF THE INVENTION

Exemplary embodiments of the present general inventive concept are directed to a storage device capable of conducting a high integrity ECC operation during copy-back operation.

Exemplary embodiments of the present general inventive concept are directed to a copy-back method for enhancing integrity of copy-back data of storage device, for example, SSD or flash memory device.

Additional aspects and features of the present general inventive concept will be set forth in part in the description which follows and, in part, will be obvious from the description, or may be learned by practice of the general inventive concept.

Features of the present general inventive concept may be realized by a storage device including a non-volatile memory device to output a read data read from a source area, and a memory controller configured to execute an ECC operation on a plurality of vectors in the read data and to write the error-corrected read data into target area of the non-volatile memory device, wherein the memory controller declares that a vector corresponding to a clean area is decoding pass without a flag bit among the plurality of vectors during the error correction operation.

Features of the present general inventive concept may also be realized by a copy-back method of a storage device that includes a non-volatile memory device, the method including reading data from a source page of the non-volatile memory device, performing an ECC operation on each of the plurality of vectors in the read data, wherein among the plurality of vectors, a vector corresponding to a clean sector is determined as decoding pass, and writing the decoded data via the ECC operation into a target page of the non-volatile memory device.

Features of the present general inventive concept may also be realized by a storage device including a non-volatile memory to receive data in increments of sectors and to output data in increments of pages, each page comprising a plurality of sectors and a controller to perform an error correction coding (ECC) operation on a plurality of vectors corresponding to the plurality of sectors, respectively, including performing error correction coding on at least one vector corresponding to a used sector and at least one "all ones" vector corresponding to a clean sector by detecting when a vector includes all logical "1"s without referring to a flag bit of any one of the plurality of vectors.

Features of the present general inventive concept may also be realized by a storage device, including a non-volatile memory to receive data in increments of sectors and to output data in increments of pages, each page comprising a plurality of sectors, and a controller to perform an error correction coding (ECC) operation on a plurality of vectors corresponding to the plurality of sectors, respectively, including performing error correction coding on at least one vector corresponding to a used sector and at least one "all ones" vector corresponding to a clean sector by inverting the logical value of each vector prior to error correction encoding.

The controller may include an ECC unit to perform the error correction coding, and an inverter to receive each of the plurality of vectors, to invert the logical values of each vector, and to output the inverted plurality of vectors to the ECC unit.

Features of the present general inventive concept may also be realized by a storage device including a non-volatile memory to receive data in increments of sectors and to output data in increments of pages, each page comprising a plurality of sectors, and a controller to perform an error correction coding (ECC) operation on a plurality of vectors corresponding to the plurality of sectors, respectively, including performing error correction coding on at least one vector corresponding to a used sector and at least one "all ones" vector corresponding to a clean sector by detecting the "all ones" vector and preventing the error correction coding operation with respect to the "all ones" vector.

The controller may include an ECC unit to perform the error correction coding, and an "all ones" vector detection unit to receive each of the plurality of vectors from the non-volatile memory, to detect the "all ones" vector, and to output a control signal to the ECC unit to prevent the error correction coding operation with respect to the "all ones" vector.

Features of the present general inventive concept may also be realized by a storage device including a non-volatile memory to receive data in increments of sectors and to output data in increments of pages, each page comprising a plurality of sectors, and a controller to receive from the non-volatile memory a plurality of vectors corresponding to the plurality of sectors, respectively, including at least one vector corresponding to a used sector and at least one "all ones" vector corresponding to a clean sector, to perform an error correction coding (ECC) operation on each of plurality of vectors, and to output the plurality of error-coded vectors to the non-volatile memory.

The controller may include an ECC unit to perform the error correction coding, and a memory interface to interface with each of the non-volatile memory and the ECC unit, to transmit the plurality of vectors from the non-volatile memory to the ECC unit and from the ECC unit to the non-volatile memory.

The ECC unit may detect when a vector includes all logical "1"s without referring to a flag bit of any one of the plurality of vectors and performs error correction coding on the vector including all logical "1"s.

The storage device may further include an inverter, and the inverter may invert the logical value of each vector prior to error correction encoding, and the ECC unit may perform error correction coding on the inverted plurality of vectors.

Features of the present general inventive concept may also be realized by a control unit including a memory interface unit to receive data from a non-volatile memory device and to transfer data to the non-volatile memory device, and an error correction coding (ECC) unit to receive from the memory interface a plurality of sectors of data including clean sectors having all logical "1"'s and used sectors having at least one logical "0", to decode and encode each of the plurality of sectors, and to output the plurality of sectors to the memory interface to be transmitted back to the non-volatile memory device.

The control unit may include an inverter to receive each of the plurality of sectors from the memory interface, to invert the logical values of the plurality of sectors, and to output the inverted plurality of sectors to the ECC unit.

The ECC unit may detect a clean sector by detecting whether the sector comprises only logical "1"s, and performs error correction coding on the clean sector.

Features of the present general inventive concept may also be realized by a control unit including a memory interface unit to receive a plurality of sectors of data from a non-volatile memory device, the plurality of sectors including clean sectors having all logical "1"'s and used sectors having at least one logical "0", and to transmit a plurality of encoded sectors to the non-volatile memory device, an error correction coding (ECC) unit to perform error correction coding and decoding and to transmit to the memory interface the plurality of encoded sectors, and an "all ones" vector detection unit receive from the memory interface the plurality of sectors, to determine which of the sectors is a clean sector, and to transmit to the ECC unit a control signal to prevent error correction coding of each clean sector from among the plurality of sectors.

Features of the present general inventive concept may also be realized by a method of performing a copy-back operation of a non-volatile memory device, the method including receiving from the non-volatile memory device a plurality of vectors of data including at least one "all ones" vector in which each element is a logical "1" and at least one vector having at least one logical "0", performing error correction coding on the plurality of vectors, and transmitting the plurality of error correction coded vectors to the non-volatile memory device.

Performing error correction coding may include detecting the at least one "all ones" vector by determining whether the vector includes all logical "1"s without referring to a flag bit of any of the plurality of vectors, and performing error correction coding on the "all ones" vector.

The method may further include inverting the logical values of each element of the plurality of vectors prior to performing error correction coding.

Performing error correction coding may include detecting the at least one "all ones" vector and controlling an error correction coding unit to not perform error correction coding on the at least one "all ones" vector.

BRIEF DESCRIPTION OF THE DRAWINGS

These and/or other aspects and features of the present general inventive concept will become apparent and more readily appreciated from the following description of the embodiments, taken in conjunction with the accompanying drawings of which:

FIG. 6A and FIG. 6B are diagrams illustrating another embodiment of the ECC operation shown in FIG. 3;

DETAILED DESCRIPTION OF THE PREFERRED EMBODIMENTS

Figure 1:
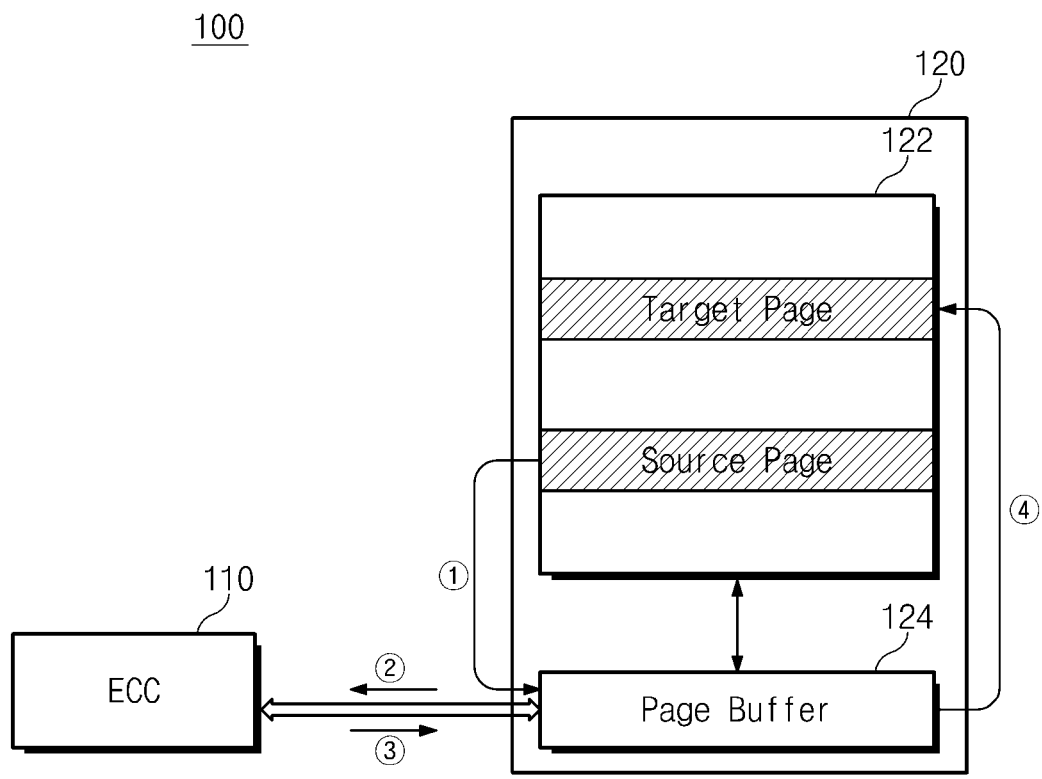
FIG. 1 is a block diagram schematically showing semi-external copy-back operation.

The present general inventive concept will now be described more fully hereinafter with reference to the accompanying drawings, in which preferred embodiments of the general inventive concept are shown. This general inventive concept, however, may be embodied in many different forms and should not be construed as limited to the embodiments set forth herein. Rather, these embodiments are provided so that this disclosure will be thorough and complete, and will fully convey the scope of the general inventive concept to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

In the specification and claims, a flash memory device and SSD are used as examples of storage devices to illustrate the characteristics and functions of the general inventive concept. However, those skilled in the art can easily understand other features of the inventive concept according to the descriptions. The inventive concept may be implemented or applied through other embodiments. In addition, the detailed description may be amended or modified according to viewpoints and applications, without departing from the scope, technical idea, and other objects of the inventive concept.

In the specification, the term 'vector' is used to describe a data unit corresponding to an encoding or decoding unit. The term 'code word' can be used to describe narrower meaning of the Vector. The term 'decoding pass' of present general inventive concept means 'decoding success' of the ECC decoding operation. In other words, the 'decoding pass' of present general inventive concept means 'not declaring decoding fail' after the ECC decoding operation, and when the decoding pass has occurred, the ECC decoding operation has successfully completed.

FIG. 1 is a block diagram schematically showing copy-back operation of a storage device. Referring to FIG. 1, a storage device 100 comprises an ECC unit 110 and a non-volatile memory device 120.

The ECC unit 110 detects or corrects errors in the read data from the non-volatile memory device 120. Below, 'ECC operation' will be used to describe an error detecting and correcting operation. In an ECC encoding operation, the ECC unit 110 translates input data into code words or vectors. In an ECC decoding operation, ECC unit 110 detects errors in the decoded data and corrects the detected errors.

The non-volatile memory device 120 comprises a cell array 122 and a page buffer 124. The cell array 122 comprises a plurality of memory cells connected to a bit line and a word line respectively. At least one page (e.g., 2 KByte) of data can be written to a plurality of memory cells connected to one word line. A page buffer 124 operates as either a write driver or a sense amplifier based on an operation mode. For example, the page buffer 124 operates as a sense amplifier in a read operation mode and operates as a write driver in a program operation mode.

During the copy-back operation, the data stored in the source page of the cell array 122 is read and latched on the page buffer 124. The read data on the page buffer 124 is transferred to the ECC unit 110. The ECC unit 110 performs an ECC operation on the read data that has been transferred to the ECC unit 110. The processed data on the ECC operation is transferred back to the page buffer 124. The processed data transferred to the page buffer 124 is written to the target page of the cell array 122.

The copy-back operation classified into a semi-external copy-back using external buffering and an internal copy-back that does not apply external buffering. The operation of the semi-external copy-back is performed along the data path (1→2→3→4). However, in an internal copy-back operation, the non-volatile memory device 120 does not output the read data from the cell array 122. In other words, the operation of the internal copy-back is performed along the data path (1→4).

Thus, the copy-back operation does not limited by the relative location of the ECC unit 110. Below, the copy-back operation will be classified as copy-back accompanied by an ECC operation and copy-back without an ECC operation.

Figure 2:
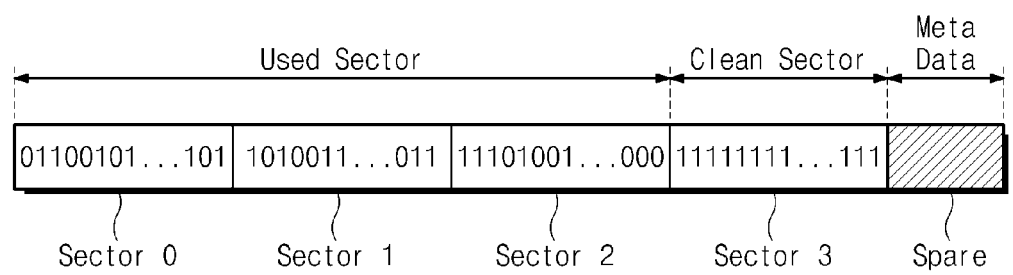
FIG. 2 is a block diagram showing a page data of a flash memory.

FIG. 2 is a block diagram showing a page data read from a flash memory device. Referring to FIG. 2, the page data comprises user data field (sector0~sector3) and a spare field. The spare field comprises meta data which corresponds to control information of the user data.

In a conventional flash memory device, data is programmed or read by the page unit. Recently, a programming a portion (e.g. one sector) of the page per one program cycle has become available. In other words, data may be programmed or read in segments smaller than a page. The page memory cells in one word line are divided into a predetermined number of parts, and the respective parts of the memory cells may be programmed individually. This is called "a partial program" or "a random program". According to the partial program scheme, data can be programmed by sector unit. Thus, 'a used sector' and 'a clean sector' can coexist in a same page of data. The 'used sector' refers to written data. The 'clean sector' refers to a data portion read from erased memory cells or non-programmed memory cells.

As mentioned above, one logical page data read from one physical page of the memory cell array may comprise both clean sectors and used sectors. With respect to the clean sector, the host does not attempt to access the clean sector to obtain data. However, a problem may arise in a copy-back operation, in which a page unit of data is transferred from one area to the other area during the copy-back operation. Thus, data will be read and programmed by page unit to copy from source area to target area. Since the page may include both a used sector and a clean sector, the clean sector may be read along with the used sector in an ECC operation.

In a used sector, the control information of the user data is included in the meta data. For instance, an error control code of user data, bad block marking information, and flag bits may be included in the meta data. Since the clean sector does not include the same meta data as a used sector, the clean sector should be managed separately in the copy-back operation accompanied by the ECC operation. Thus, the clean sector must be distinguished from the used sector. In a conventional flash memory device, a flag bit is included in the meta data to distinguish a clean sector from a used sector.

However, providing the flag bit in the meta data and processing the flag bit for each sector may burden the operation of the storage device 100. The flag bit is mainly used on copy-back operation accompanied by the ECC operation. The flag bit is generated and inserted to the meta data whenever page data is programmed.

Thus, present general inventive concept discloses a storage device that performs copy-back operation without a flag bit to distinguish between a clean sector and a used sector. The storage device of present general inventive concept can perform the ECC operation on the clean sector without flag bit during the copy-back operation.

In some instances, all the physical pages of a memory block that store overwritten data may be read to detect a valid page. In this case, a read page which comprises all sectors corresponding to clean sectors, or in which each sector is a clean sector, may be exist. The advantage of the present general inventive concept can be applied to not only copy-back operations but also a read operation on a clean sector.

Figure 3:
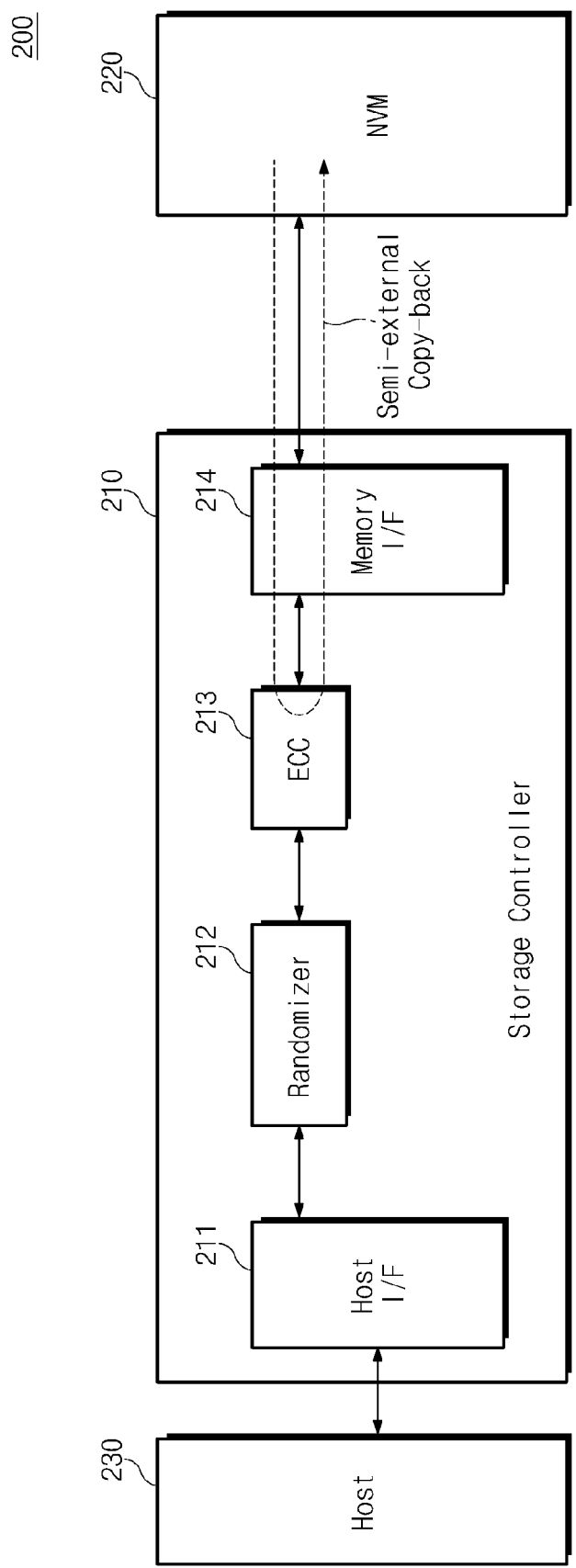
FIG. 3 is a block diagram showing a storage device and copy-back operation in accordance with the first embodiment of present general inventive concept.

FIG. 3 is a block diagram showing a storage device 200 and copy-back operation in accordance with an embodiment of present general inventive concept. Referring to the FIG. 3, storage device 200 comprises a storage controller 210 and a non-volatile memory device 220.

A host 230 may control the storage device 200 when to transfer data between the host 230 and storage device 200. For example, a host device 230 may be an electronic device such as personal/mobile computer, PDP, PMP, MP3 player HDTV and so on.

The storage controller 210 accesses the non-volatile memory device 220 in response to the request from the host 230. The storage controller 210 may control the non-volatile memory device 220 to manage internal memory during a garbage collection operation or a merge operation. The storage controller 210 may also control the non-volatile memory device to perform a copy-back operation during the garbage collection operation or the merge operation.

The storage controller 210 is supplied with the read data from the source page of the non-volatile memory device 220 during the copy-back operation accompanied by the ECC operation. The storage controller 210 performs the ECC operation on the read data. The storage device programs the error corrected data to the target page of the non-volatile memory device 220.

The storage controller 210 may include a host interface 211, a randomizer 212, an ECC unit 213, and a memory interface 214. The host interface 211 supplies a physical interconnection between the host and the storage device 200. In other words, the host interface 211 may communicate with the external host through Universal Serial Bus (USB), Small Computer System Interface (SCSI), PCI Express, ATA, Parallel ATA (PATA), Serial ATA (SATA), or Serial Attached SCSI (SAS).

The randomizer 212 performs a randomize operation on the programming data. The randomizer 212 also performs de-randomize operation on read data from the non-volatile memory device 220. A data arrangement of the randomized data is altered from the original data. By programming the randomized data into the memory cells, interference between the memory cells can be averaged. Additionally, enhancing the data security is available via the randomize operation.

The ECC unit 213 encodes the program data from the randomizer 212 according to an ECC operation. The ECC unit 213 partitions the program data into code words, which are the smallest unit of ECC operation. The ECC unit 213 generates parity of the code words.

In addition, the ECC unit 213 performs decoding on the read data from the non-volatile memory device 220. In the decoding operation, the ECC unit 213 detects an error of the read data by referring to the parity bits of the data. If one or more bits of error are detected, the ECC unit 213 calculates the error location and error value to correct the detected error. The ECC unit 213 transfers the error corrected data to the randomizer 212.

The ECC unit 213 can perform the ECC operation on a clean sector that is included in the copy-back data during the copy-back operation. For instance, in a semi-external copy-back operation, the ECC unit 213 can identify a sector in which each bit has a logic value of '1' as a clean sector without reference to a flag bit. In other words, the ECC unit 213 can perform the ECC operation on the clean sector during copy-back operation.

In a copy-back operation, the ECC unit 213 can perform the ECC operation on the clean sector by being configured to generate a syndrome and zero vector, as described below.

The parity check matrix H of the ECC unit can be expressed as Equation 1 below.

$$S = Hc^T = 0 \qquad \text{[Equation 1]}$$

(S is syndrome, H is parity check matrix, $c^T$ is transposed matrix of the code word c)

All bits of a vector corresponding to a clean sector are logic '1'. This vector will be referred to as an "all one" vector'. Conversely, the vector having all logic '0' bits will be referred to as an "all zero" vector'. In general, the "all zero" vector is defined as a code word in every ECC scheme. However, an "all one" vector is not defined as code word in each ECC scheme. Some ECCs define the "all one" vector as a code word, while other ECCs do not. The ECC unit 213 of present general inventive concept has decoding ability on the "all one" vector.

The memory interface 214 provides a communication interface between the storage controller 210 and the non-volatile memory device 220.

The non-volatile memory device 220 can be a memory device that performs the copy-back operation or data control operation accompanied by the ECC operation. The non-volatile memory device 220 can include a flash memory device or resistive memory such as PRAM (Phase Change Random Access Memory), and RRAM (Resistance Random Access Memory). The non-volatile memory device 220 can include one of the storage elements such as NFGM (Nano Floating Gate Memory), PoRAM (Polymer Random Access Memory), MRAM (Magnetic Random Access Memory), and FRAM (Ferroelectric Random Access Memory).

According to above-described embodiment, during a copy-back operation, the ECC unit 213 performs the ECC decoding operation on the clean sector or "all one" vector without using a flag bit.

Figure 4:
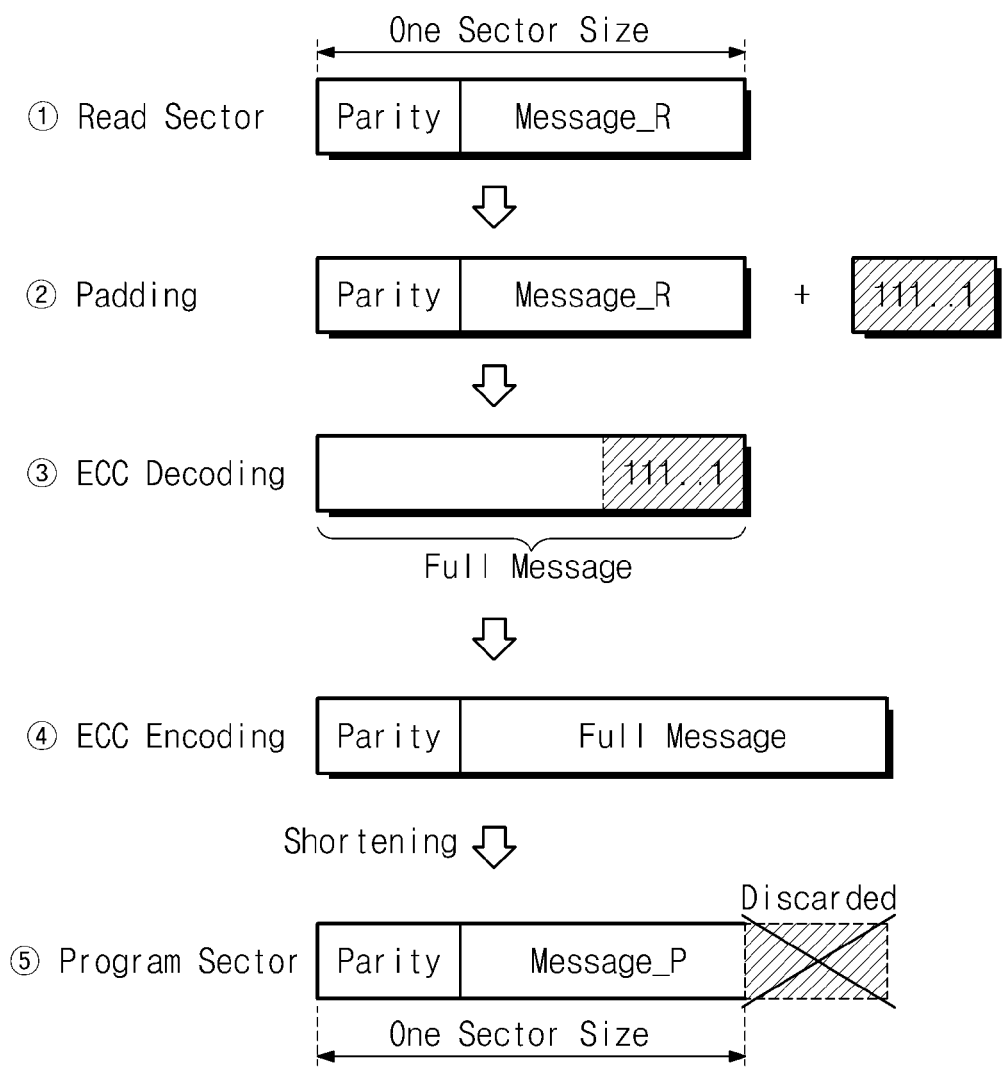
FIG. 4 is a diagram illustrating one embodiment of the ECC operation shown in FIG. 3.

FIG. 4 is a diagram illustrating one embodiment of the copy-back operation shown in FIG. 3. Referring to the FIG. 4, a copy-back operation may be performed when there is a mismatch between the code word size and sector size while supporting the ECC operation of an "all one" vector. For example, the binary BCH code (Bose-Chaudhuri-Hochquenghem code) and RM code (Reed-Muller code) correspond to such a case.

To match the size of a code word and a sector, the binary BCH code and RM code use a padding process or a shortening process in the ECC operation. The padding process refers to inserting predetermined bits onto a sector to perform an ECC decoding. Conversely, the shortening process refers to eliminating a predetermined number of bits after performing an ECC encoding operation. Neither the padding process nor the shortening process affects the Hamming distance of the code word. Thus, the error correction ability of the code word which has been processed by a padding process or a shortening process does not vary from that of original code word.

In step 1, the storage controller 210 reads out the source page of the non-volatile memory device 220 for a copy-back operation. Each of the sectors which is read from the source page is transmitted to the ECC unit 213 via the memory interface 214. Each of the sectors read from the non-volatile memory device 220 is composed of a parity part Parity and message part Message_R.

In step 2, the ECC unit 213 adds all one bits (1111 . . . 1) in the end part of the sector read from the non-volatile memory device 220. Such a process is called as 'Padding', as mentioned above. In other words, since the sector is too short to perform the ECC operation, the padded "all one" bits may satisfy predetermined size requirements of a code word. As a result of the padding operation, the code word size generated by the ECC encoding operation may be longer than that of one sector.

In step 3, the ECC unit 213 performs the ECC decoding on the code word modified by the padding process. The ECC unit 213 performs the error detection/correction referring to the parity part.

In step 4, the ECC unit 213 performs ECC encoding on the error corrected full message. In consequence of the ECC encoding, the parity of the full message is generated. After the ECC encoding, the parity and the full message form one code word. However, the code word size formed after the ECC encoding exceeds one sector size.

Thus, in step 5, the ECC unit 213 performs a 'shortening' operation on the code word generated by the ECC encoding to match a predetermined sector size. The ECC unit 213 shortens one part of the full message and discards the shortened one part. The ECC unit 213 programs or writes the left full message and parity into the non-volatile memory device 220. A plurality of sectors each of which are generated by above method compose one page data unit.

According to the above-described copy-back operation, the ECC engine which supports an "all one" vector, such as the binary BCH code (Bose-Chaudhuri-Hochquenghem code) and RM code (Reed-Muller code) can manage the clean sector easily.

Figure 5:
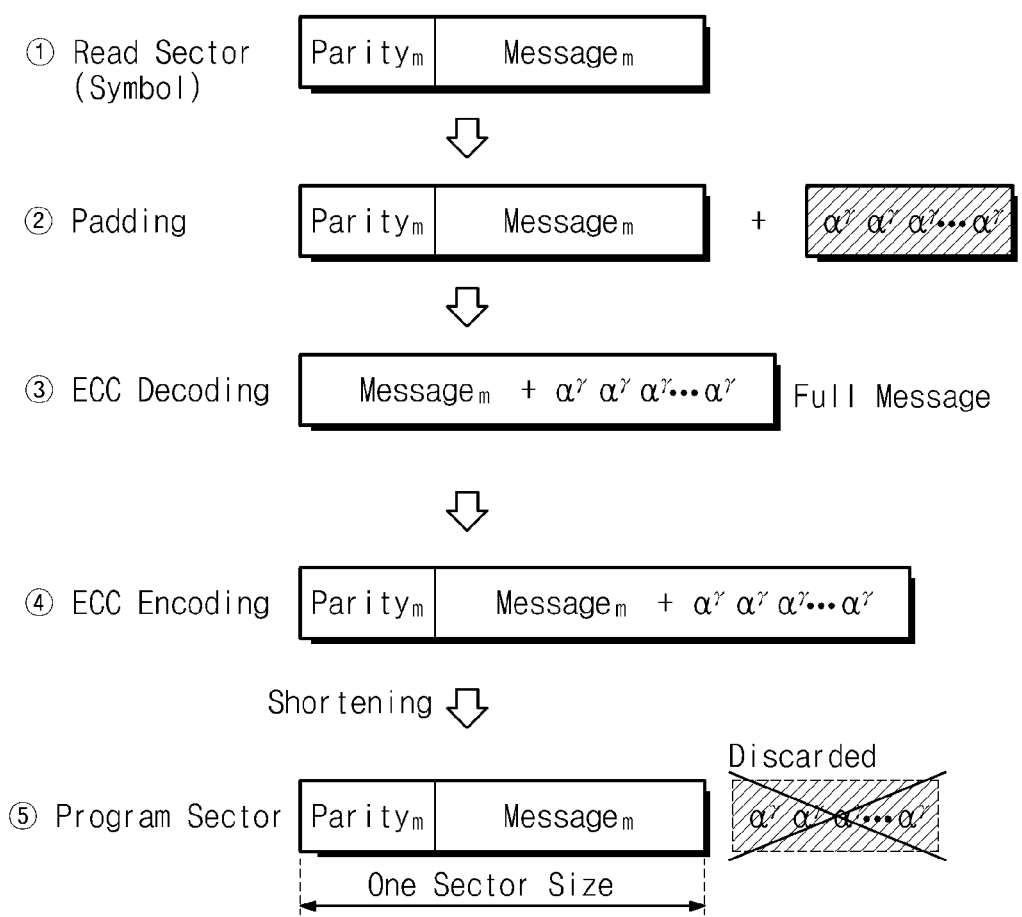
FIG. 5 is a diagram illustrating another embodiment of the ECC operation shown in FIG. 3.

FIG. 5 is a diagram illustrating a non-binary ECC operation shown in FIG. 3. Referring to FIG. 5, 'Padding' or 'Shortening' scheme can be applied to a non-binary ECC operation, such as RS code (Reed-Solomon code).

In step 1, the ECC unit 213 receives data from the non-volatile memory device 220 for copy-back operation. The data from the non-volatile memory device 220 can be m-ary data (e.g. primary, secondary, tertiary, etc.). To supply the m-ary data for a high performance ECC operation, the binary data from the non-volatile memory device 220 may be transformed into non-binary data. The read data from the non-volatile memory 220 includes parity data Paritym and message data Messagem.

An "all one" vector is defined in the RS code as a code word. In the code word polynomial $c(x)=1+x+x2+\ldots+xn-1$, code word $c(x)$ is not binary description but an m-ary description. Thus, it is necessary to multiply code word $c(x)$ by element $\alpha\gamma$. The element $\alpha\gamma$ is an element of $GF(2m)$. The element $\alpha\gamma$ corresponds to an m-bit "all one" vector if transformed to binary description.

In step 2, the 'Padding' operation is performed on the end of the message part Messagem. The ECC unit 213 adds the m-ary element ($\alpha\gamma\ \alpha\gamma\ \alpha\gamma\ \ldots\ \alpha\gamma$) which corresponds to (1111 . . . 1) in binary description to the code word (Paritym+Messagem) read from the non-volatile memory device 220.

In step 3, the ECC unit 213 performs the ECC decoding on the code word generated by the padding process. The ECC unit 213 performs the error detection/correction referring to the parity data Paritym.

In step 4, the ECC unit 213 performs the ECC encoding on the error corrected full message (Messagem+$\alpha\gamma\ \alpha\gamma\ \alpha\gamma\ \ldots\ \alpha\gamma$). In consequence of the ECC encoding, the parity of the full message (Messagem+$\alpha\gamma\ \alpha\gamma\ \alpha\gamma\ \ldots\ \alpha\gamma$) is generated. If there is no error in the full message (Messagem+$\alpha\gamma\ \alpha\gamma\ \alpha\gamma\ \ldots\ \alpha\gamma$), newly generated parity is the same as that of read sector Paritym. After the ECC encoding, the parity and the full message (Paritym+Messagem+$\alpha\gamma\ \alpha\gamma\ \alpha\gamma\ \ldots\ \alpha\gamma$) forms one code word. However, the resulting code word size exceeds the size of one sector. Thus, a 'shortening' process is necessary to program or write the parity and the full message (Paritym+Messagem+$\alpha\gamma\ \alpha\gamma\ \alpha\gamma\ \ldots\ \alpha\gamma$) into the non-volatile memory device 220.

In step 5, the ECC unit 213 performs 'shortening' on the code word (Paritym+Messagem+$\alpha\gamma\ \alpha\gamma\ \alpha\gamma\ \ldots\ \alpha\gamma$) generated by the ECC encoding to match the size of a sector. The ECC unit 213 discards one part of the full message. The discarded part may correspond to a right-most part of the message, for example. The ECC unit 213 programs or writes the remaining message part Message$_m$ and parity part Parity$_m$ to the non-volatile memory device 220. Pluralities of sectors each of which are generated by above method compose one page data unit.

According to the above-described copy-back operation, the ECC engine which supports all one vector, such as the binary BCH code (Bose-Chaudhuri-Hochquenghem code) and RM code (Reed-Muller code) can manage the clean sector easily. In a copy-back operation, the length of code word can be adjusted to a proper length according to a standard of the non-volatile memory device 220 by a shortening process and a padding process. The padding data of the copy-back operation is an "all one" vector. Therefore, even if correctable errors occur on the clean sector of the source page, the sector to be programmed to the target page can be kept as a clean sector during the copy-back operation.

FIG. 6A and FIG. 6B are diagrams illustrating LDPC (Low-Density Parity Check) code that supports the copy-back operation on a clean sector. In the parity check matrix of the LDPC code, the number of element '0' is relatively large compared with code word length. Therefore, the LDPC code can provide high coding gain and low load of ECC operation. In each of FIG. 6A and FIG. 6B, organization method of parity check matrix H to support the "all one" vector corresponding to a clean sector.

Referring to the FIG. 6A, a parity check matrix H of (7, 3) LDPC code is illustrated. The parity check matrix H which can supply a zero vector syndrome after a parity check operation on the "all one" vector. In the other words, parity check matrix H can generate syndrome S as zero vector with the parity check operation on "all one" vector c=[1111111].

The syndrome S of the "all one" vector c under the parity check matrix H can be described as equation 2 as below.

$$S = Hc^T \quad \text{[Equation 1]}$$
$$= \begin{bmatrix} 1+0+1+0+1+0+1, \\ 1+1+0+0+1+1+0, \\ 0+1+1+1+0+0+1 \end{bmatrix}^T$$
$$= [0, 0, 0]^T$$

The add operation '+' on the GF(2) in the equation 2 corresponds to exclusive or XOR operation. To supply a zero vector syndrome S after a parity check operation on the "all one" vector c=[1111111], the number of element '1' within each of the row of the parity check matrix H must configured to be 'even'.

The example of a parity check matrix H which fulfills above-described condition is illustrated in FIG. 6A. Generally, the number of element '0' is larger than that of element '1' in the parity check matrix of the LDPC (Low-Density Parity Check) code. The parity check matrix H of FIG. 6A is an example for convenience of explanation. The weight, which means the number of element '1' of the row 1 of the parity check matrix H, is '4'. The weights of the row 2 and row 3 of the parity check matrix H are '4' respectively. Therefore, the parity check matrix H can generate the zero vector syndrome against the "all one" vector c=[1111111]. This represents that the ECC unit can generate a decoding pass after the ECC operation on an "all one" vector c=[1111111] or clean sector.

FIG. 6B illustrates another method of designing a parity check matrix H of LDPC code. Referring to FIG. 6B, firstly, a (n−1, k) parity check matrix H' is arranged and then the matrix e is added to the (n−1, k) parity check matrix H' for adjusting the weight of the rows.

The weight of row 1 and row 3 are odd-numbered (i.e. '3'). Therefore, the row weight of row 1 and row 3 of the (n−1, k) parity check matrix H' should be adjusted to an even number. Hence, the matrix e is added to the (n−1, k) parity check matrix H' for composing the parity check matrix H. The parity check matrix H adjusted by the matrix e has row weights of '4', which is an even number. Therefore, the zero vector syndrome can be generated by the parity check operation on the "all one" vector c=[1111111].

Figure 7:
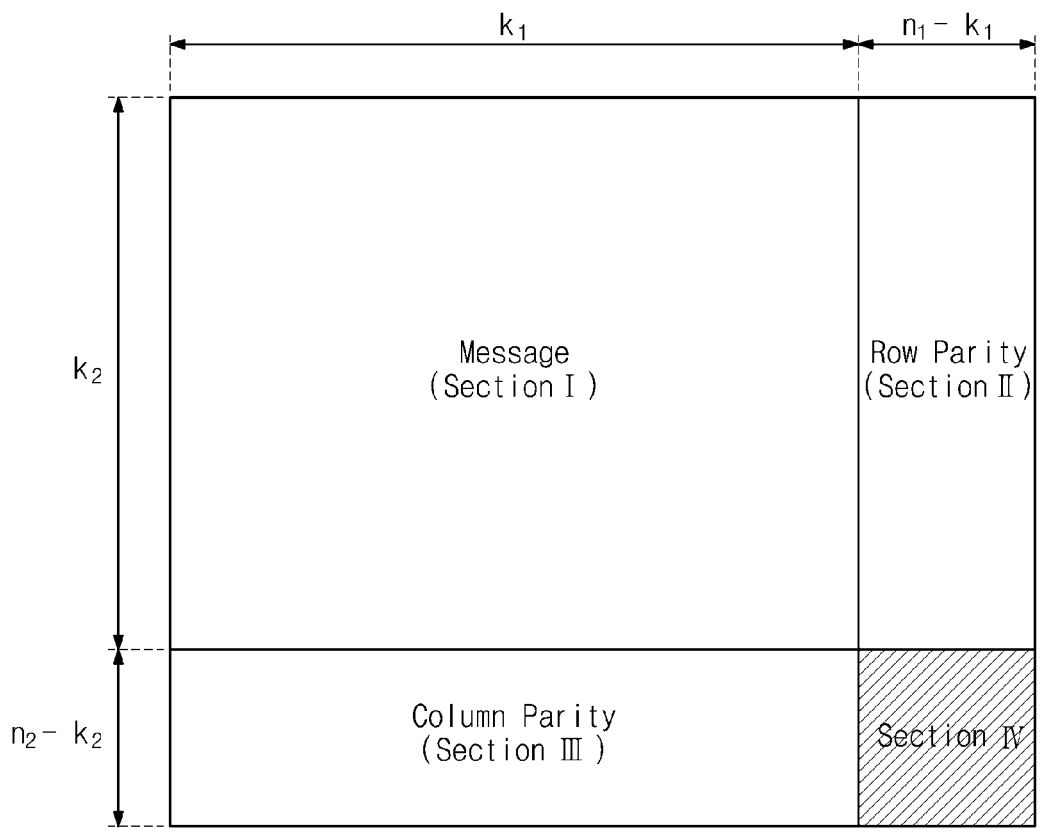
FIG. 7 is a diagram illustrating another embodiment of the ECC operation shown in FIG. 3.

FIG. 7 is a diagram illustrating embodiment of the ECC operation using a Product code. Referring to FIG. 7, a ($n_1$, $k_1$, $n_2$, $k_2$) product code is illustrated.

The ($n_1$, $k_1$, $n_2$, $k_2$) product code is composed of a ($n_1$, $k_1$) component code and a ($n_2$, $k_2$) component code. The ($n_1$, $k_1$) component code and the ($n_2$, $k_2$) component code can be generated by an ECC scheme such as the binary BCH code, RM code, RS code, and LDPC code. Each of the ($n_1$, $k_1$) component code and the ($n_2$, $k_2$) component code can have an "all one" vector so that the ($n_1$, $k_1$, $n_2$, $k_2$) product code have an "all one" vector.

The message size of the product code is $k_1 \times k_2$. The message part of the product code is illustrated as Section I. To generate the ($n_1$, $k_1$, $n_2$, $k_2$) product code, $k_1 \times k_2$ symbols are arranged to $k_1 \times k_2$ matrix. In case of encoding the $k_1 \times k_2$ matrix with the ($n_2$, $k_2$) component code by the column direction, a $k_1 \times (n_2-k_2)$ column parity may be generated. The $k_1 \times (n_2-k_2)$ column parity is illustrated as Section III. Consequently, $k_1 \times n_2$ matrix composed of Section I and Section III can be generated.

In succession, encoding the $k_1 \times n_2$ matrix with the ($n_1$, $k_1$) component code by the row direction for generating a ($n_1-k_1$)$\times n_2$ row parity. The ($n_1-k_1$)$\times n_2$ row parity is illustrated as Section II and Section IV. With the product code, the interleaving effect can be expected. Thus, an error concentrated in a specific memory area or memory cell can be dispersed. Here, the Section IV of the product code may be used as row parity or column parity. Otherwise, the Section IV of the product code may be used for any other predetermined use.

The advantages of ECC algorithms based on the present general inventive concept have been illustrated with respect to FIG. 3 to FIG. 7. However, it is easily understood that the technical features of present general inventive concept are not limited the above-described embodiments. The processing method of an "all one" vector may also be applied to Convolutional code, RSC code, and Turbo code, for example.

Figure 8:
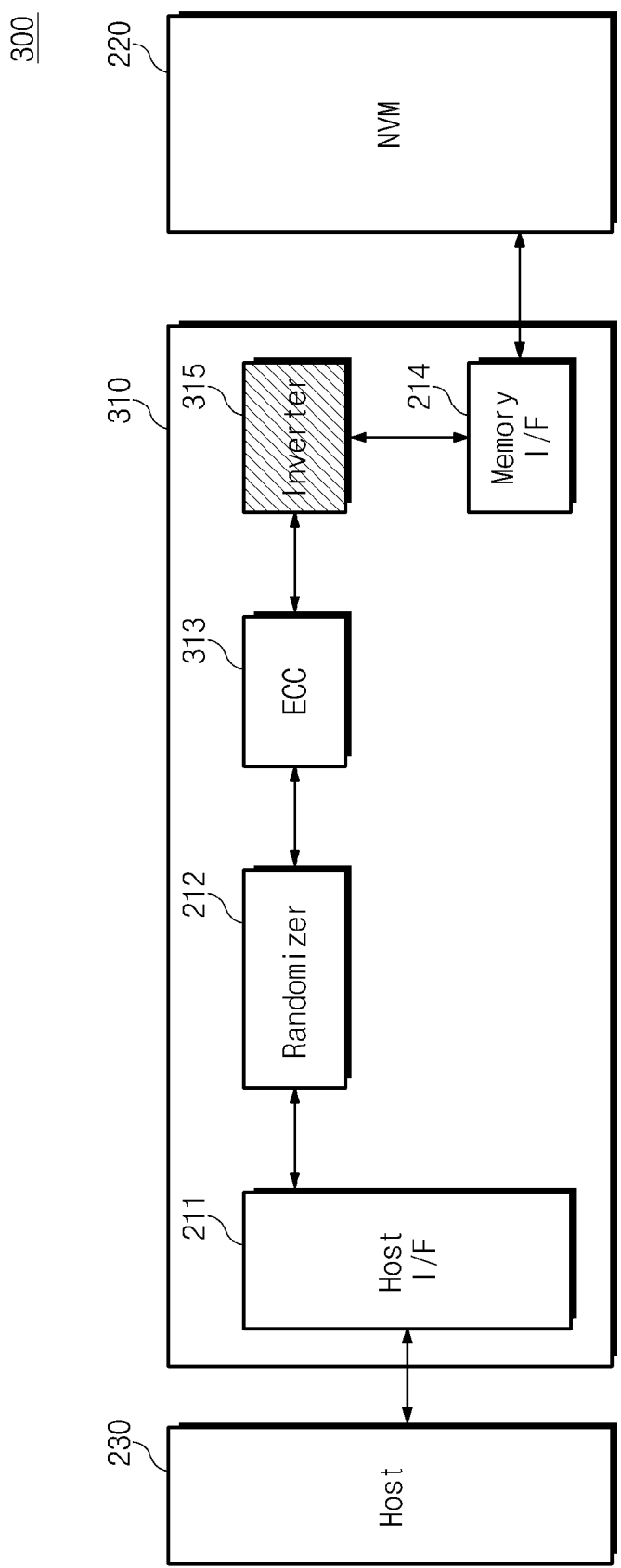
FIG. 8 is a block diagram of the storage device in accordance with an embodiment of present general inventive concept.

FIG. 8 is a block diagram of the storage device in accordance with an embodiment of present general inventive concept. Referring to FIG. 8, a storage device 300 comprises a storage controller 310 and a non-volatile memory device 220. An ECC unit 213 located in the storage controller 310 need not define the "all one" vector as a code word, since the read data from the non-volatile memory device 220 is inverted before being transferred to the ECC unit 213.

The storage controller 310 accesses the non-volatile memory device 220 in response to the request from the Host 230. The storage controller 310 controls the non-volatile memory device 220 to perform a memory management operation, such as garbage collection or merge operation. The storage controller 310 controls the non-volatile memory device 220 to perform a copy-back operation for garbage collection or merge operation.

During a copy-back operation, the storage controller 310 is provided with the read data from the source page of the non-volatile memory device 220 during the copy-back operation accompanied by the error detection or error correction operation. The storage controller 310 performs an ECC operation on the read data and programs or writes the error corrected data to a target page of the non-volatile memory device 220.

The storage controller 310 comprises a host interface 211, a randomizer 212, the ECC unit 313, an inverter 315 and a memory interface 214. The host interface 211, the randomizer 212, the memory interface 214, and the non-volatile memory device 220 are substantially the same as those illustrated in the FIG. 3. Thus, the explanations of these elements will be omitted here.

However, the ECC unit 313 in the storage controller 310 is not same as the ECC unit 213 of FIG. 3. The ECC unit 313 may not have the ability of processing the "all one" vector. As a result, the ECC unit 313 may generate a decoding fail after the ECC operation on an "all one" vector.

The load of ECC operation on the "all one" vector is eliminated by the inverter 315. To transfer the read data from the non-volatile memory device 220 to the ECC unit 313, the read data passes through the inverter 315. The "all one" vector c=[11111 . . . 1] is inverted to an "all zero" vector z=[00000 . . . 0] by the inverter 213. In a general ECC algorithm, an "all zero" vector z=[00000 . . . 0] is defined initially. Any parity check matrix can generate an "all zero" vector syndrome on the zero vector input. Thus, the "all one" vector problem caused by a clean sector can be eliminated.

The ECC decoded copy-back data is written into the non-volatile memory device 220. At this point, the "all zero" vector z=[00000 . . . 0] is inverted back to an "all one" vector c=[11111 . . . 1] by the inverter 213 and then written into the target page of the non-volatile memory device 220.

Figure 9:
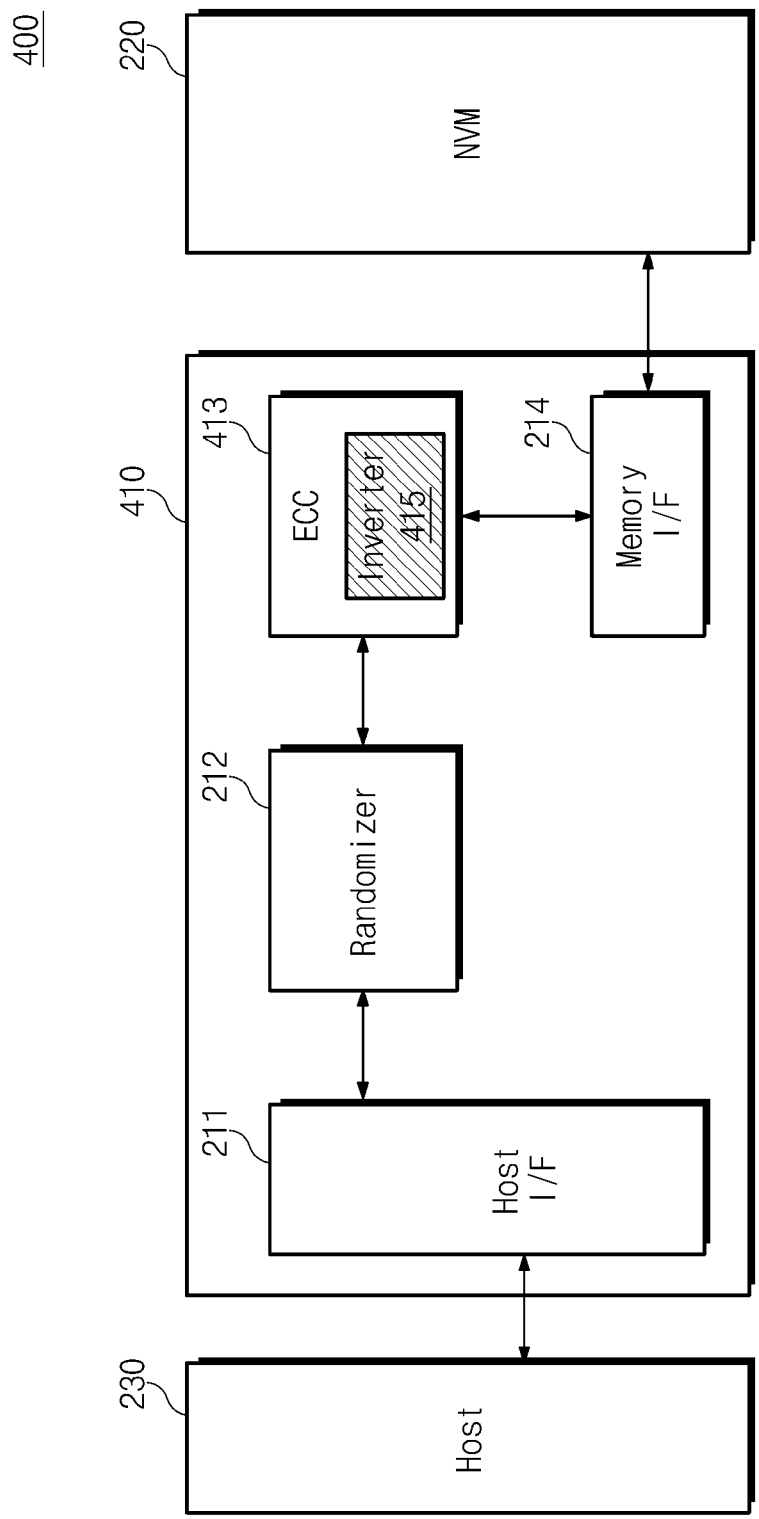
FIG. 9 is a block diagram of the storage device in accordance with another embodiment of present general inventive concept.

FIG. 9 is a block diagram of a storage device in accordance with an embodiment of present general inventive concept. Referring to the FIG. 9, the storage device 400 comprises a storage controller 410 and a non-volatile memory device 220. The storage controller 410 comprises an ECC unit 413 which performs an inverting operation. The host interface 211, the randomizer 212, the memory interface 214, and the non-volatile memory device 220 are substantially the same as those illustrated in the FIG. 8. Thus, the explanations of these elements will be omitted here.

The ECC unit 413 included in the storage controller 410 can perform decoding operation on the "all one" vector. The processing ability on the "all one" vector is supplied by an inverting function on the read-data from the non-volatile memory device 220, not by the parity check matrix. In other words, the data transferred to the ECC unit 413 for a copy-back operation is toggled by the inverter 415 before the ECC operation. If there is an "all one" vector in the data transferred to the ECC unit 413 for the copy-back operation, the "all one" vector is converted into an "all zero" vector. The "all one" vector can be handled in the ECC unit 413 that operates an ECC algorithm lacking an "all one" vector processing function. Thus, the copy-back problem caused by the clean sector can be eliminated.

Figure 10:
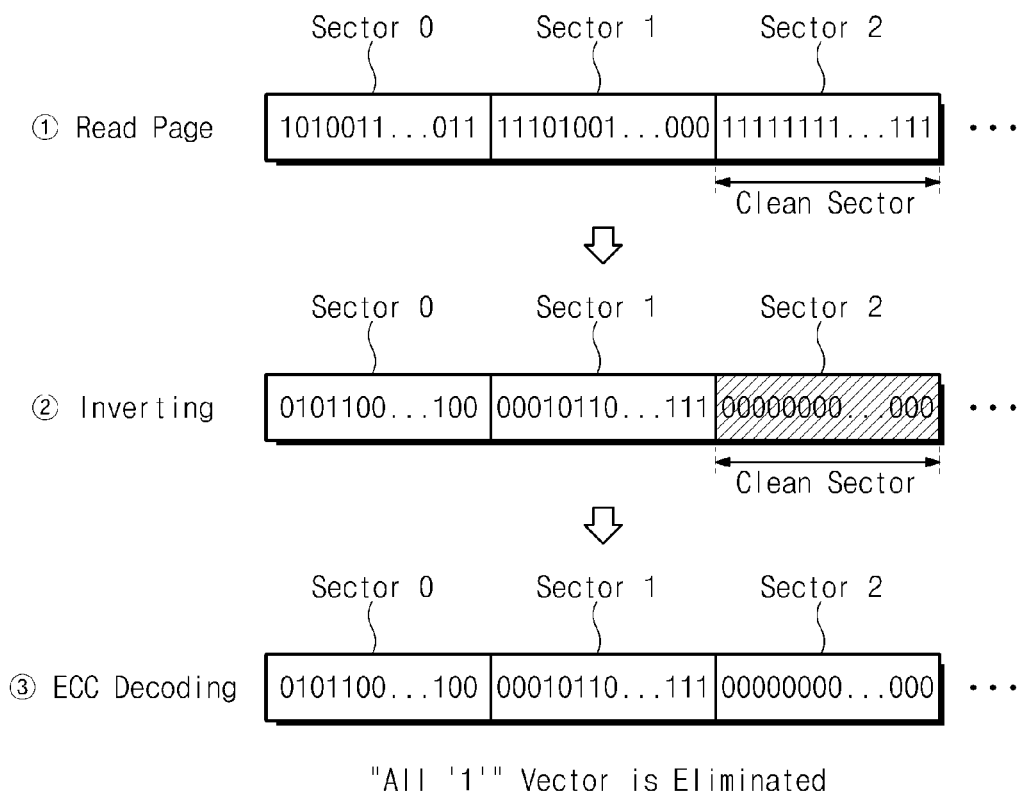
FIG. 10 is a diagram illustrating the copy-back operation shown in FIG. 8 and FIG. 9.

FIG. 10 is a diagram illustrating the data processing procedure shown in FIG. 8 and FIG. 9. Referring to the FIG. 10, the error caused by the clean sector can be solved via the inverter or inverting function during the external-copy back operation.

In step 1, the clean sector (i.e., Sector 2) may be located among the data read from the source page of the non-volatile memory device 220 for a copy-back operation. The read data is classified into a plurality of code words for error detection and correction. The clean sector (Sector 2) is classified as an "all one" vector. In a general error detection operation on the clean sector, un-correctable error may be detected as a result of the "all one" vector.

In step 2, all bits of the read data read from the source page of the non-volatile memory device 220 for copy-back operation are inverted. The data in the used sector (Sector 0, Sector 1) is encoded by the randomizer 212, the ECC unit 413, and the inverter 415. Thus, the inverted sectors can be processed in the error detection or correction operation during the copy-back operation. While the host 230 would not access the clean sector (Sector 2) during a normal read operation to obtain data from the non-volatile memory 220, the clean sector is unavoidably read out in a copy-back operation. The read clean sector is inverted for the ECC operation.

In step 3, the ECC unit (313 or 413) performs the ECC decoding on the code word which was inverted by the inverter (315 or 415). At this time, the "all zero" vector corresponding to the clean sector can be outputted to zero vector syndrome under any parity check matrix. Thus, the code word corresponding to clean sector does not generate a decoding error during the ECC operation.

After the ECC decoding operation, the decoded data is again inverted and programmed or written into the non-volatile memory device (220). The non-volatile memory device (220) receives the data and composes page unit data. The page unit data may be programmed into the target page of the non-volatile memory device (220).

Figure 11:
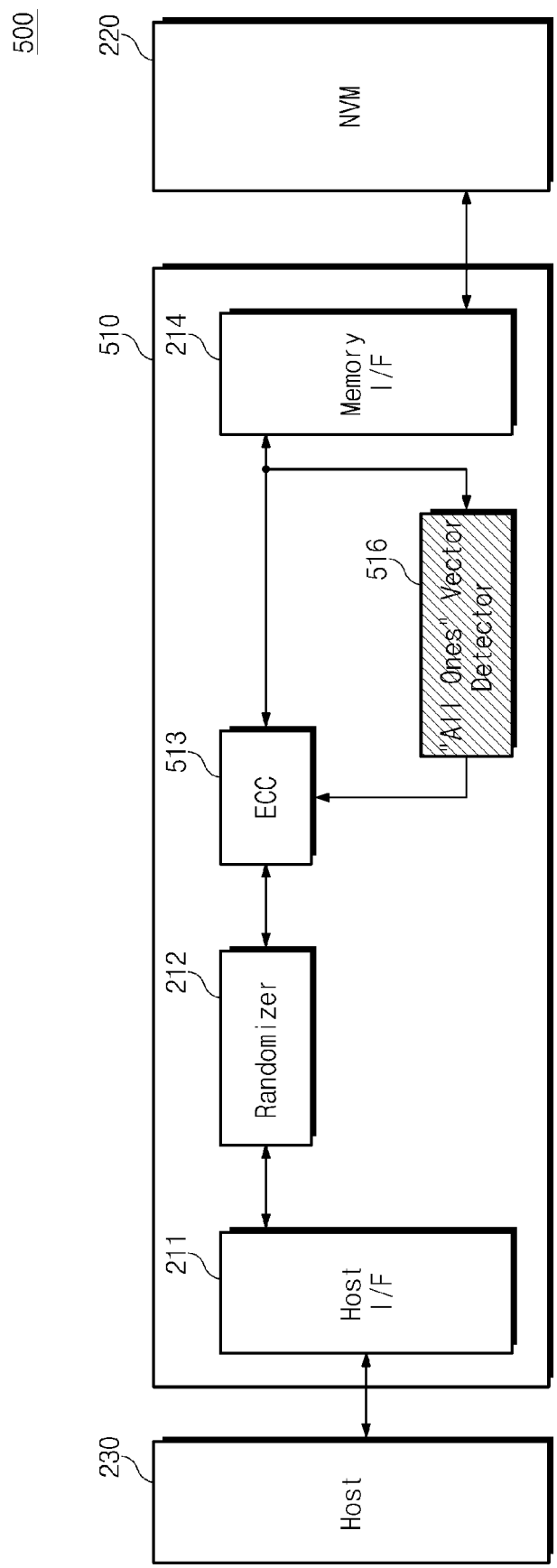
FIG. 11 is a block diagram showing a storage device and copy-back operation in accordance with another embodiment of present general inventive concept.

FIG. 11 is a block diagram of the storage device in accordance with another embodiment of present general inventive concept. Referring to FIG. 11, a storage device 500 comprises a storage controller 510 and a non-volatile memory device 220. The storage controller 510 detects the clean sector among the sectors read out from the non-volatile memory device 220 during the copy-back operation, and inactivates the ECC operation on the code word corresponding to the clean sector. A more detailed description will be set forth as follows.

The storage controller 220 comprises a Host interface 211, a Randomizer 212, an ECC unit 513, an "all ones" vector detector 516 and a Memory interface 214. The Host interface 211, the Randomizer 212, the Memory interface 214 and the non-volatile memory device 220 are substantially the same as that of FIG. 3 and FIG. 8. Thus, the explanations of these elements will be omitted here.

The ECC unit 513 activates and inactivates the ECC operation on the code word provided from the non-volatile memory device 220 under the control of the "all ones" vector detector 516 during the copy-back operation. The "all ones" vector detector 516 detects an "all ones" vector in the readout data of a copy-back operation. If a code word corresponding to an all ones vector is transferred to the ECC unit 513, the "all ones" vector detector 516 controls the ECC unit 513 to block the ECC operation on the code word.

The "all ones" vector detector 516 determines, without reference to a flag bit, whether the received code word is an "all ones" vector. For example, the "all ones" vector detector 516 may determine that a code word is an "all ones" vector when a number of logic '1' in the code word is larger than a reference number. The all ones vector detector 516 may determine that a code word is an "all ones" vector when a number of logic '0' in the code word is smaller than a reference number. In such a configuration, a tolerance for error caused by reading the clean sector can be supplied.

Figure 12:
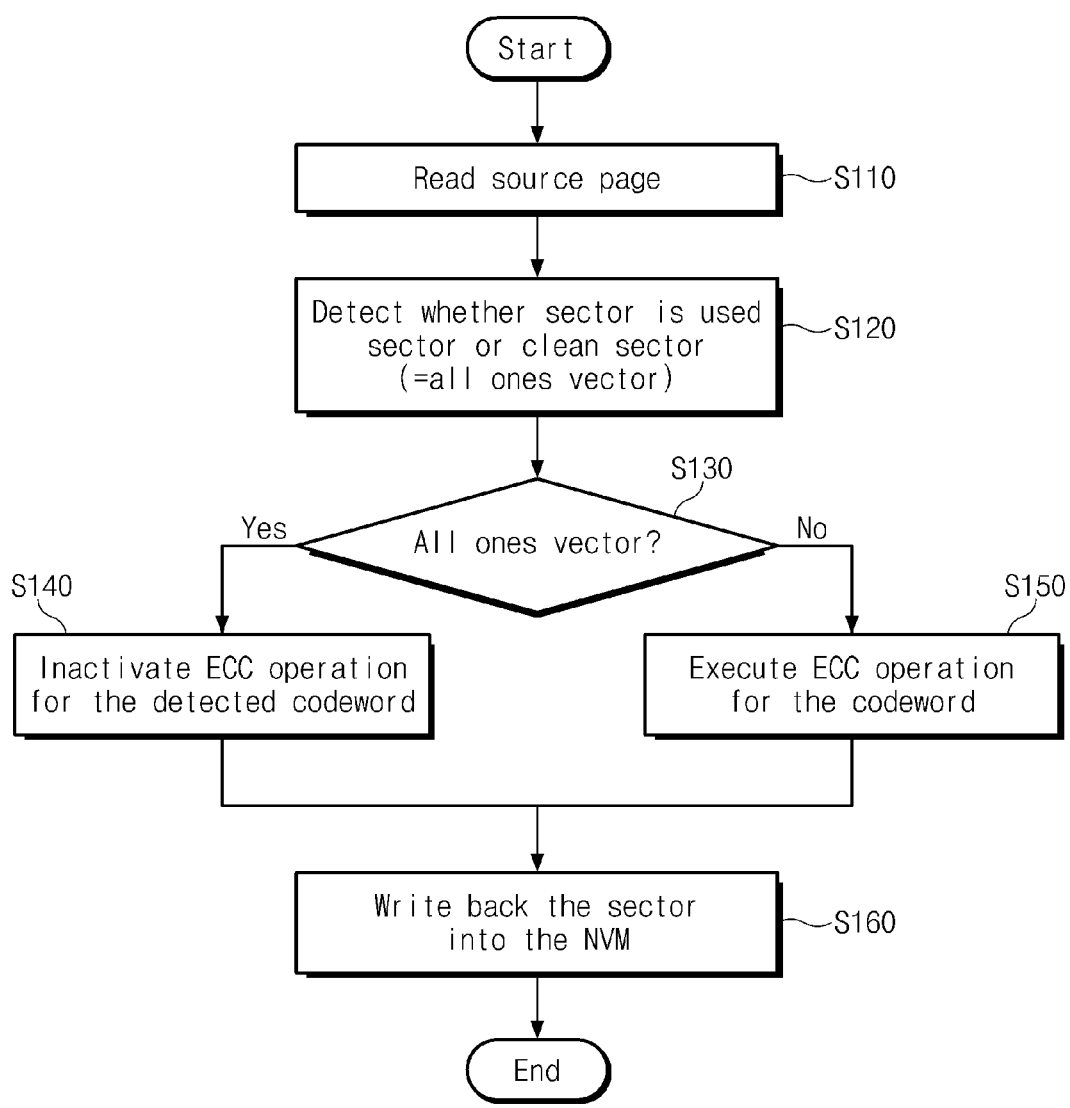
FIG. 12 is a diagram illustrating the copy-back operation shown in FIG. 11.

FIG. 12 is a flow chart illustrating the copy-back operation of the non-volatile memory device shown in FIG. 11. Referring to FIG. 12, the ECC operation performed by the ECC unit 513 is activated/inactivated by the "all ones" vector detector 516.

In operation S110, the Storage controller 510 read source data from the source page of the Non-volatile memory device 220. The copy-back operation is performed in increments of pages. Thus, a clean sector of a page may be read during the copy-back operation.

In operation S120, the read data is transferred to the ECC unit 513 and the "all ones" vector detector 516 by sector or code word unit via the Memory interface 214. At this time, the "all ones" vector detector 516 determines whether the received code word is a used sector or a clean sector.

In operation S130, if the transmitted sector or code word is an "all ones vector", the procedure moves to operation S140 for inactivating the ECC operation. On the other hand, if the transmitted sector or code word is not an "all ones" vector, the procedure moves to operation S150 for activating the ECC operation.

In operation S140, the ECC unit 513 skips the ECC operation on the transmitted sector or code word. The decoding algorithm of the ECC unit 513 may not support the "all ones" vector processing. Thus, decoding error may occur during the ECC operation on the "all ones" vector if the ECC decoding were to be performed on the "all ones" vector. However, under the control of the "all ones" vector detector 516, the ECC operation in the ECC unit 513 is inactivated when an "all one" vector is transferred to the ECC unit 513. Thus, generation of the decoding error caused by the "all ones" vector can be avoided.

In operation S150, the ECC unit 513 performs ECC operation on the transferred sector or code word.

In operation S160, the Storage controller 510 programs or writes the decoded data from the ECC unit 513 into the Non-volatile memory device 220.

Figure 13:
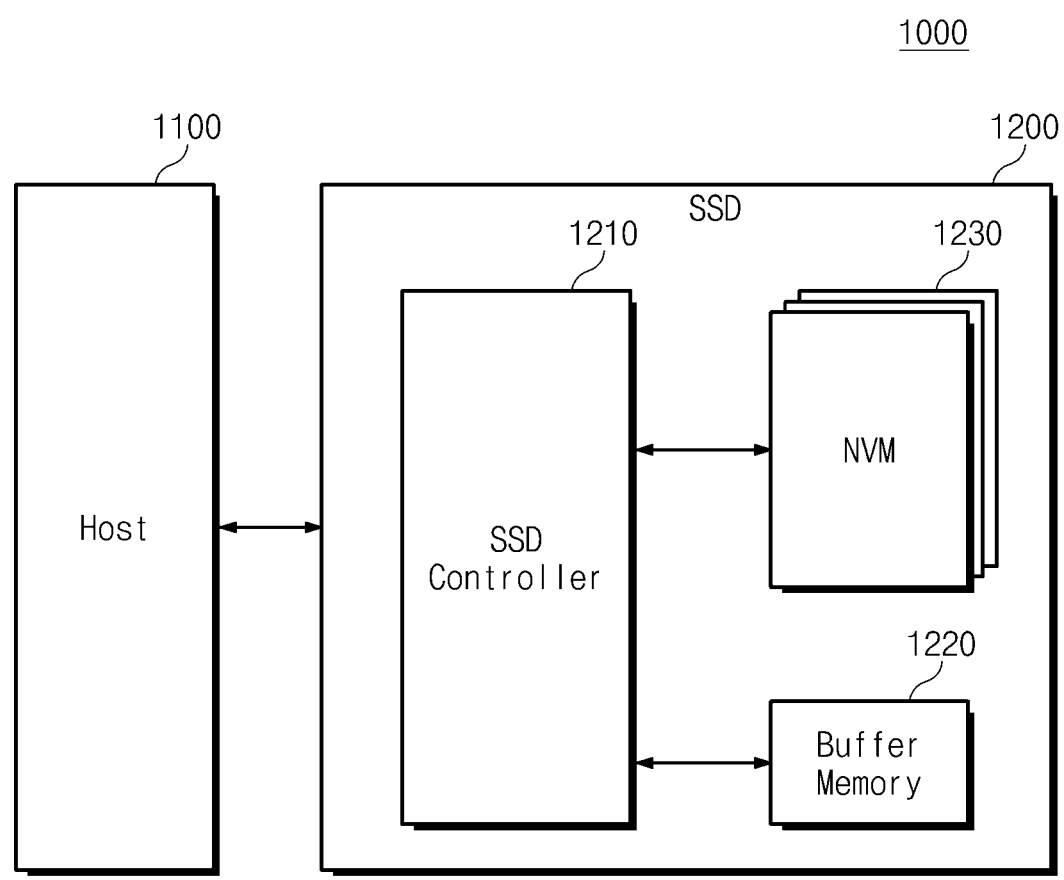
FIG. 13 is a block diagram of the SSD performing the copy-back operation in accordance with present general inventive concept.

FIG. 13 is a block diagram of a solid state drive SSD system performing the copy-back operation in accordance with an embodiment of present general inventive concept. Referring to FIG. 13, an SSD system 1000 according to an exemplary embodiment of the inventive concept includes a host 1100 and an SSD 1200. The SSD 1200 includes an SSD controller 1210, a buffer memory 1220, and a nonvolatile memory device 1230.

The SSD controller 1210 provides a physical interface with the host 1100 and the SSD 1200. That is, the SSD controller 1210 provides an interface with the SSD 1200 according to the bus format of the host 1100. In particular, the SSD controller 1210 decodes a command received from the host 1100.

According to the decoding result, the SSD controller 1210 accesses the nonvolatile memory device 1230. Examples of the bus format of the host 1100 include USB (Universal Serial Bus), SCSI (Small Computer System Interface), PCI express, ATA, PATA (Parallel ATA), SATA (Serial ATA), and SAS (Serial Attached SCSI).

The SSD controller 1210 performs the external (or semi-external) copy-back operation that processes an "all ones" vector or clean sector without flag bit. In other words, the SSD controller 1210 may comprise one of the ECC units illustrated in the above-described embodiments of present general inventive concept. The SSD controller 1210 may comprise the ECC unit which can process the clean sector or "all ones" vector. The SSD controller 1210 may comprise the inverter which inverts the bit value of clean sector or "all ones" vector. The SSD controller 1210 may comprise the "all ones" vector detector which detects clean sector or all ones vector without a flag bit.

The buffer memory 1220 temporarily stores write data provided from the host 1100 or data read from the nonvolatile memory device 1230. If the data in the nonvolatile memory device 1230 are cached at a read request of the host 1100, the buffer memory 1220 supports a cache function of directly providing the cached data to the host 1100. Typically, the data transfer rate according to the bus format (e.g., SATA or SAS) of the host 1100 is much higher than the data transfer rate of a memory channel of the SSD 1200. That is, if the interface speed of the host 1100 is much higher, a mass buffer memory 1220 is provided to minimize the performance degradation caused by the speed difference.

The buffer memory 1220 may include a synchronous DRAM to provide sufficient buffering in the SSD 1200 used as a mass auxiliary memory device. However, those skilled in the art will readily understand that the buffer memory 1220 is not limited to the disclosure herein.

The nonvolatile memory device 1230 may be provided as a storage medium of the SSD 1200. For example, the nonvolatile memory device 1230 may be provided as a NAND flash memory device with mass storage capability. The nonvolatile memory device 1230 may include a plurality of memory devices. In this case, the respective memory devices are connected to the SSD controller 1210 on a channel-by-channel basis. Although it has been described that the storage medium includes the nonvolatile memory device 1230 such as a NAND flash memory device, the storage medium may include other types of nonvolatile memory devices. For example, PRAM, MRAM, ReRAM, FRAM, or NOR flash memory devices may be used as the storage medium, and a memory system with a hybrid of different types of memory devices may be applicable. Also, the storage medium may include volatile memory devices (e.g., DRAM devices).

Figure 14:
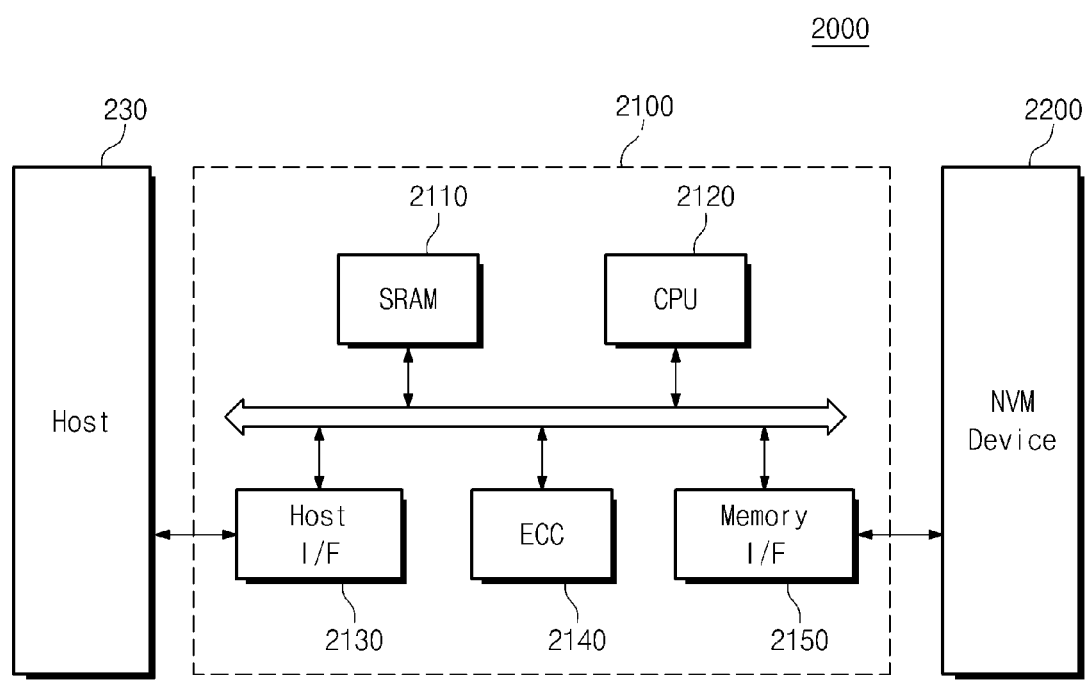
FIG. 14 is a block diagram of the memory card performing the copy-back operation in accordance with present general inventive concept.

FIG. 14 is a block diagram of a memory system according to an exemplary embodiment of the inventive concept. Referring to FIG. 14, a memory system 2000 according to an exemplary embodiment of the inventive concept includes a nonvolatile memory (NVM) device 2200 and a memory controller 2100.

A combination of the nonvolatile memory device 2200 and the memory controller 2100 may be provided as a memory card or a solid state disk (SSD). An SRAM 2110 is used as a working memory of a processing unit 2120. A host interface (I/F) 2130 has the data exchange protocol of a host connected to the memory system 2000. An error correction code (ECC) block 2140 detects/corrects an error in data read from the nonvolatile memory device 2200. A memory interface (I/F) 2150 interfaces with the nonvolatile memory device 2200. A processing unit 2120 performs an overall control operation for data exchange of the memory controller 2100.

Although not illustrated in FIG. 14, those skilled in the art will readily understand that the memory system 2000 may further include a ROM storing code data for interfacing with the host.

The memory controller 2100 performs the external (or semi-external) copy-back operation that processes an "all ones" vector or clean sector without flag bit. In other words, the memory controller 2100 may comprise one of the ECC units illustrated in the above-described embodiments of present general inventive concept. The memory controller 2100 may comprise the ECC unit which can process the clean sector or "all ones" vector. The memory controller 2100 may comprise the inverter which inverts the bit value of clean sector or "all ones" vector. The memory controller 2100 may comprise the "all ones" vector detector which detects a clean sector or "all ones" vector without using a flag bit.

The nonvolatile memory device 2200 may be provided as a multi-chip package including a plurality of flash memory chips. The memory system 2000 may be provided as a high-reliability storage medium with a low error probability. In particular, the flash memory device of the inventive concept may be provided in a memory system such as a solid state disk (SSD). In this case, the memory controller 2100 may be configured to communicate with an external device (e.g., the host) through one of various interface protocols such as USB, MMC, PCI-E, SAS, ATA, SATA, PATA, SCSI, and IDE.

Figure 15:
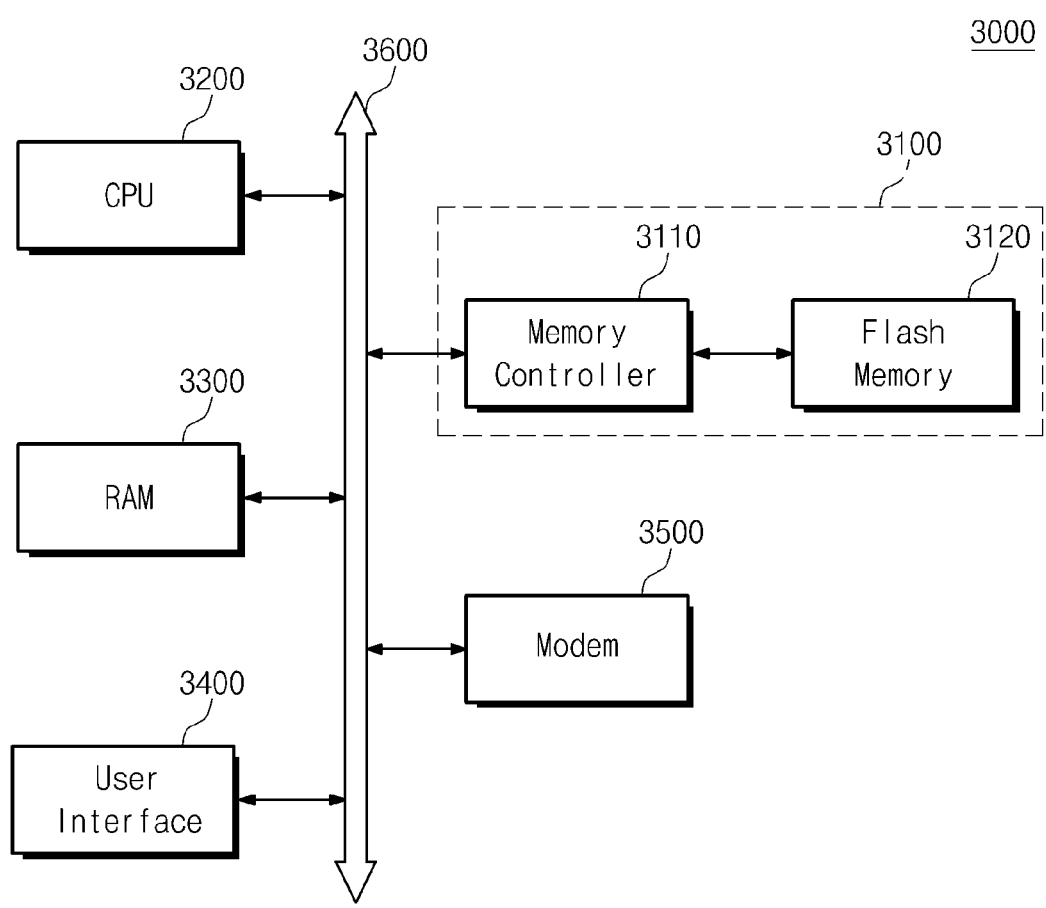
FIG. 15 is a block diagram of a computer system including the flash memory device performing the copy-back operation in accordance with present general inventive concept.

FIG. 15 is a block diagram of a computing system including a nonvolatile memory device according to an exemplary embodiment of the present general inventive concept.

Referring to FIG. 15, a computing system 3000 according to an exemplary embodiment of the inventive concept includes a microprocessor (i.e., CPU) 3200, a RAM 3300, a user interface 3400, a modem 3500 such as a baseband chipset, and a memory system 3100 that are electrically connected to a system bus 3600. The memory system 3100 may be configured in the same way as illustrated in FIG. 14. The memory system 3100 comprises a memory controller 3110 and a flash memory device 3120. If the computing system 3000 is a mobile device, the computing system 3000 may further include a battery (not illustrated) for providing an operation voltage. Although not illustrated in FIG. 15, those skilled in the art will readily that the computing system 3000 may further include an application chipset, a camera image processor, and a mobile DRAM. For example, the memory system 3100 may constitute a solid state drive/disk (SSD) that uses a nonvolatile memory device to store data. Also, the memory system 3100 may be provided as a fusion flash memory device (e.g., a One-NAND flash memory device).

The memory controller 3110 performs the external (or semi-external) copy-back operation that processes an "all ones" vector or clean sector without using a flag bit. In other words, the memory controller 3110 may comprise one of the ECC units illustrated in the above-described embodiments of present general inventive concept. The memory controller 3100 may comprise the ECC unit which can process the clean sector or "all ones" vector. The memory controller 3110 may comprise the inverter which inverts the bit value of clean sector or "all ones" vector. The memory controller 3110 may comprise the "all ones" vector detector which detects a clean sector or an "all ones" vector without using a flag bit.

In the present specification and claims, the term "without using a flag bit" means, "using no flag bit," or "not using any flag bit." In other words, the term should not be interpreted to mean that although one flag bit is not used, another may be used for the same purpose. The present general inventive concept provides an apparatus and method to perform error correction on page data that includes "all one" vectors without the need for any flag bit to indicate which vectors of the page may be "all one" vectors.

The nonvolatile memory device and/or the memory controller according to the inventive concept may be mounted in various types of packages. Examples of the packages of the nonvolatile memory device and/or the memory controller include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the use of the inventive concept can considerably increase the reliability of read data by providing an improved error correction capability. Also, the use of the inventive concept can increase the yield because even a memory device lacking a spare region for column redundancy can be used as a good product without being treated as a defective product.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A storage device comprising:
   a non-volatile memory device to output read data from a source area of the non-volatile memory device; and
   a memory controller configured to execute an error correction code (ECC) operation on a plurality of vectors in the read data and to write the error-corrected read data into a target area of the non-volatile memory device,
   wherein the memory controller determines that a vector corresponding to a unit of non-programmed memory cells among the plurality of vectors is decoding pass without referring to any flag bit indicating a vector programming state among the plurality of vectors during the ECC operation.

2. The storage device as set forth in claim 1, wherein the read data is page unit data which include a plurality of sectors.

3. The storage device as set forth in claim 2, wherein the plurality of vectors correspond to the plurality of sectors respectively.

4. The storage device as set forth in claim 2, wherein the non-volatile memory device writes data in sector units.

5. The storage device as set forth in claim 1, wherein the memory controller defines an "all one" vector in which each data element is a logical "1" as the vector corresponding to the unit of non-programmed memory cells.

6. The storage device as set forth in claim 5, wherein the memory controller comprises an ECC unit configured to generate a zero vector syndrome in response to the "all one" vector.

7. The storage device as set forth in claim 6, wherein, when a length of the vector corresponding to the unit of non-programmed memory cells and a length of a write data unit are different, the ECC unit matches the length of the vector corresponding to the unit of non-programmed memory cells and the write data unit by using a shortening process.

8. The storage device as set forth in claim 7, wherein the ECC unit regards a shortened part of the unit of non-programmed memory cells as "all one" bits or a symbol corresponding to the "all one" bits during an encoding or decoding operation and discards the shortened one part.

9. The storage device as set forth in claim 7, wherein the ECC unit executes the ECC operation according to at least one algorithm among binary BCH code, RM code, and RS code.

10. The storage device as set forth in claim 6, wherein the ECC unit modifies a row weight of a parity check matrix associated with the ECC operation to an even numbered value.

11. The storage device as set forth in claim 10, wherein the ECC unit executes the ECC operation based on a LDPC algorithm.

12. The storage device as set forth in claim 6, wherein the ECC unit executes the ECC operation according to a product code associated with at least one of a binary BCH code, a RM code, a RS code and a LDPC code.

13. The storage device as set forth in claim 1, wherein the memory controller comprises:
    an inverter to invert the plurality of vectors; and
    an ECC unit to execute an ECC operation on the plurality of inverted vectors.

14. The storage device as set forth in claim 13, wherein, during a write operation, the memory controller is configured to encode a write data via the ECC unit, to invert the encoded write data via the inverter, and to write the inverted data into the non-volatile memory device,
    wherein, during a read operation, the memory controller is configured to invert read data from the non-volatile memory device via the inverter, and to decode the inverted read data via the ECC unit.

15. The storage device as set forth in claim 1, wherein the memory controller comprises:
    an ECC unit to perform an ECC operation on the plurality of vectors; and
    an "all ones" vector detector to detect an "all ones" vector among the plurality of vectors and to inactivate the ECC operation of the ECC unit when an "all ones" vector is detected.

16. The storage device as set forth in claim 1, wherein the ECC operation is performed during a copy-back operation of the non-volatile memory device.

17. A copy-back method of a storage device that includes a non-volatile memory device, the method comprising:
    reading data from a source page of the non-volatile memory device;
    performing an error correction code (ECC) decoding operation on each of a plurality of vectors in the read data, wherein among the plurality of vectors, a vector corresponding to a clean sector is determined as decoding pass without referring to any flag bit indicating a vector programming state among the plurality of vectors during the ECC decoding operation; and writing the decoded data via the ECC decoding operation into a target page of the non-volatile memory device.

18. The method of claim 17, wherein a parity check matrix which generates a zero vector syndrome in a parity check operation in response to an "all ones" vector is supplied for the ECC decoding operation.

19. The method of claim 17, where the method further comprises:
inverting each of the plurality of vectors in the read data.

20. The method of claim 17, wherein the method further comprises:
inactivating the ECC decoding operation when a vector among the plurality of vectors corresponds to an "all ones" vector.

* * * * *